United States Patent [19]

Zommer

[11] Patent Number: 5,412,227
[45] Date of Patent: May 2, 1995

[54] MOS-CONTROLLED THYRISTOR WITH NON-PLANAR GEOMETRY

[75] Inventor: Nathan Zommer, Los Altos, Calif.

[73] Assignee: IXYS Corporation, Santa Clara, Calif.

[21] Appl. No.: 97,425

[22] Filed: Jul. 26, 1993

[51] Int. Cl.6 .................. H01L 29/74; H01L 27/02
[52] U.S. Cl. .................... 257/133; 257/132; 257/137; 257/175; 257/368
[58] Field of Search ............. 257/132, 133, 137, 138, 257/175, 368

[56] References Cited

U.S. PATENT DOCUMENTS 4,914,496  4/1990  Nakagawa et al. .............. 257/138
5,202,750  4/1993  Gough ......................... 257/175

OTHER PUBLICATIONS

Temple et al., "Inside of the MCT," *PCIM Europe* (Jan./Feb. 1993) pp. 25–26.

Primary Examiner—Ngân V. Ngô
Attorney, Agent, or Firm—Townsend and Townsend Khourie and Crew

[57] ABSTRACT

A non-planar MOS-controlled thyristor (MCT) which improved turn-off capabilities. The unique non-planar geometry brings the MOS channel region closer to the active thyristor junction, thereby reducing an "effective" resistance which inhibits turn-off of prior art devices 10. This effective resistance is a combination of the resistance through the MOS and the parasitic resistance between the MOS and active thyristor junction. For efficient thyristor turn-off at high current, the effective resistance should be about 0.6 v or less. Both the recessed gate 30 and the MCT with built-up cathode 60 have effective resistances of about 0.6 v or less.

3 Claims, 2 Drawing Sheets

MOS-CONTROLLED THYRISTOR WITH NON-PLANAR GEOMETRY

BACKGROUND OF THE INVENTION

The present invention as well as the cited prior art deal with semiconductor switching devices including MCTs, MOSFETs, IGBTs and thyristors. To aid in explaining the different characteristics of these devices, a brief overview of the various types of devices and their properties is discussed.

Goals of semiconductor switching devices include high current capability per unit area of silicon, high switching speed, low on-resistance, and ease of control. Thyristors, such as the widely accepted silicon controlled rectifiers (SCRs), potentially possess the lowest on-resistance and also have high power handling capability. However, special techniques for control, slow switching speed, and attendant high switching losses limit their usefulness. Insulated gate bipolar transistors (IGBTs), which are easier to turn on and turn off, traditionally possess higher on-resistances than thyristors. Metal oxide silicon field effect transistors (MOSFETs), also called insulated gate field effect transistors (IGFETs), provide faster switching characteristics than SCRs, but typically have a higher on-resistance. This higher on-resistance diminishes their switching performance.

MOS-controlled thyristors (MCTs), a new class of power devices, combine thyristor current and voltage capability with MOS gated turn-on and turn-off. Currently, industry builds various types of MCTs. These are p-type or n-type, symmetric or asymmetric blocking, and various turn-on alternatives including direct turn-on by light. However, all MCTs turn off the thyristor by shorting out one or both of the thyristor's emitter to base junctions. Like their MOSFET ancestors, these devices characteristically possess a high on-resistance, thereby diminishing their switching performance.

In particular, the prior art MCT possesses a large physical separation between the active thyristor junction and the MOSFET channel region. This large physical separation creates "parasitic" resistance between these two structures. The parasitic resistance impairs the MOSFET's ability to shunt the turn-on current at the thyristor base to ground, thereby causing inefficient thyristor turn-off.

SUMMARY OF THE INVENTION

The present invention provides a superior MOS-controlled thyristor (MCT) built by a combination of MOS and bipolar technology with improved turn-off capabilities. The improved device relies on a unique non-planar geometry to bring the MOSFET channel region in close proximity to the active thyristor junction. This non-planar geometry effectively reduces the parasitic resistance existing between the active thyristor junction and MOSFET channel region of the prior art device. Reducing this parasitic resistance improves the switching characteristics of the device. In particular, the improved devices provide an efficient turn-off at high current as well as a faster turn-off time.

The present invention provides, for example, embodiments having this unique non-planar geometry in a recessed gate MCT and a MCT with built-up cathode. The recessed gate MCT integrates a MOSFET within a recessed portion of a thyristor. Alternatively, the MCT with built-up cathode integrates an active thyristor cathode above a MOSFET channel region. These unique structures bring the active thyristor junction in close proximity to the MOSFET channel region, thereby reducing the parasitic resistance of the prior art. Thus, the two devices provide efficient turn-off at high current and faster switching times.

The benefits of the present invention are achieved in the context of know technology shown above. However, a further understanding of the nature and advantages of the present invention may be realized by reference to the latter portions of this specification and attached drawings.

DESCRIPTION OF THE SPECIFIC EMBODIMENT

Prior Art MCT

Figure 1:
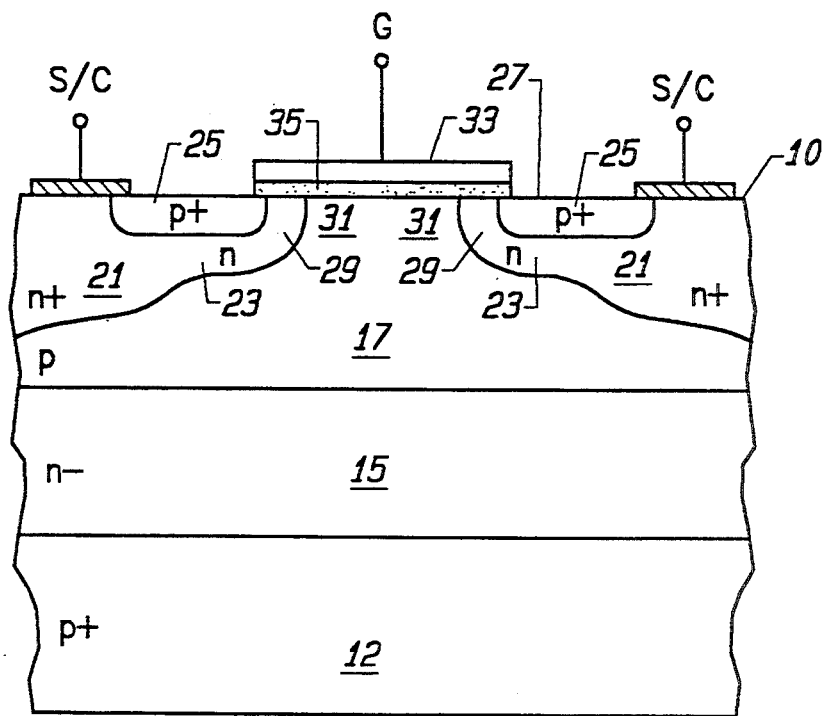
FIG. 1 is a cross-sectional view of a prior art MOS-controlled thyristor.

FIG. 1 is a simplified cross-sectional view of a prior art MOS-controlled thyristor (MCT) 10. A skilled artisan may build this device by a combination of MOS and bipolar technology. A p-n-p-n (or n-p-n-p) composite sandwich of silicon typically characterizes a thyristor. For purposes of illustration, FIG. 1 shows a device with a first p-type layer doped to form a p+ type layer 12. An n− type layer 15 overlying the first p+ type layer, and a second p-type layer 17 overlying the n− type layer is also shown. To complete the thyristor, a first n-well is formed within the second p-type layer. This first n-well is doped to form the n+ well 21 of FIG. 1. The p+ layer 12, n− layer 15, second p-type layer 17, and n+ well 21 define a thyristor. A thyristor anode (A) and cathode (C) are also shown.

The MOSFET may be a p-channel device or an n-channel device. For purposes of illustration, FIG. 1 employs a p-channel device. Fabrication may occur, for example, through a double diffused MOS (DMOS) process. As shown, the p-channel MOSFET forms an "attachment" to the n+ well of the thyristor. A second n-well 23 forms adjacent to the n+ well. A source (S) defined by a p+ region 25 forms within the second n-well, and adjacent to the surface 27 of the device. A p-channel region 29 within the second n-well is adjacent to the surface of the device, and between the p+ source region and a portion of the second p-type region 31. A drain region is defined by this portion of p-type region 31. As with all DMOS processes, FIG. 1 shows a polysilicon gate 33 overlaying a layer of gate oxide 35 to define a MOSFET gate (G). The p+ source region 25, p-channel region 29, and drain region 31 define a MOSFET.

FIG. 1 is an example of a prior art device which forms an active region of a typical chip. An active area may comprise hundreds, thousands, or even millions of these microscopically small regions. These regions may comprise cells which are all connected in parallel. Alternatively, these regions may comprise stripes, or the like defining the active device.

Switching the MCT occurs as follows. To turn on the device, a forward biasing voltage is applied to a p—n+ junction of the thyristor. One may, for example, forward bias the junction by employing switching designs similar to those of a shorted emitter structure, an IGBT, or a MOSFET. Such switching schemes turn on the device to a latched condition. To turn off the device, a negative voltage is applied to the gate of the MOSFET. This negative voltage forms a p-channel underneath the gate connecting the second p-type region to the p+ source region, thereby connecting the second p-type region to the thyristor cathode or emitter. Effectively, the p-channel creates a "shunt." This "shunt" syphons the turn-on current at the thyristor gate or base to the emitter or cathode, thereby turning the thyristor off. When properly designed, the MOSFET diverts the main thyristor current from the p—n+ junction to ground. To accomplish this, the on-resistance through the MOSFET should be low enough where the product of its current and resistance is less than the forward voltage drop through the thyristor p—n+ junction. This requirement, however, becomes complicated by the large physical separation between the p-channel region and p—n+ main conduction junction creating parasitic resistance "R." This parasitic resistance plus the resistance through the p-channel creates an "effective resistance" which causes switching problems at high current. In particular, the prior art MCT does not effectively turn off at high current.

Equivalent Circuit

Figure 2:
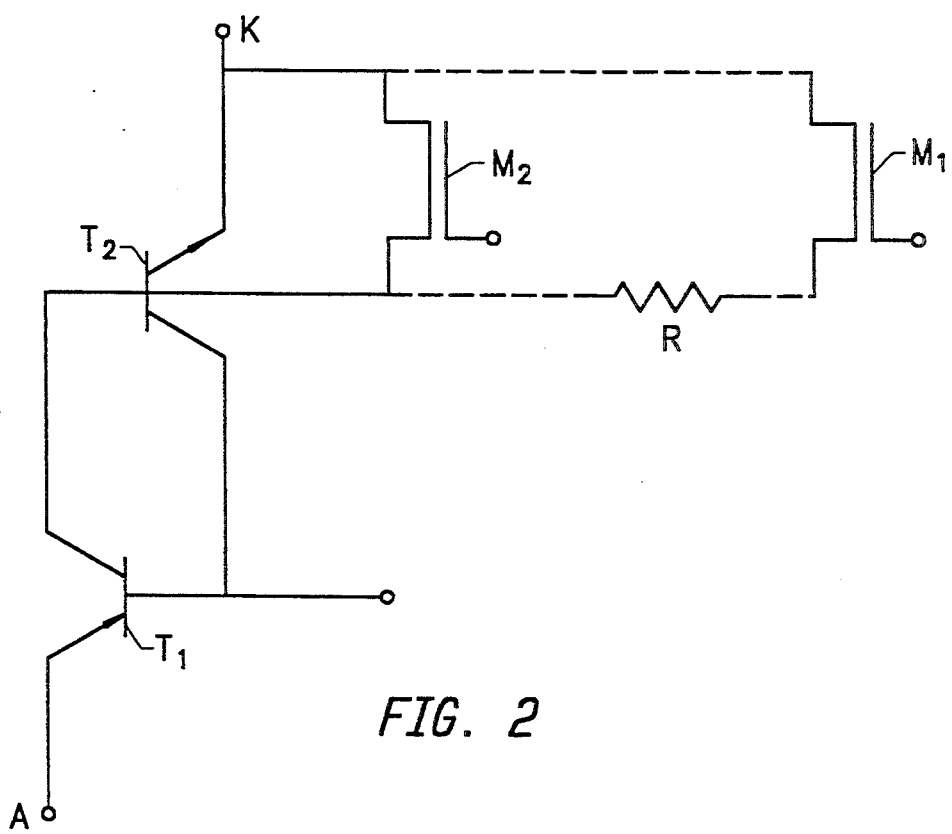
FIG. 2 is an equivalent circuit for a prior art MOS-controlled thyristor and the improved MOS-controlled thyristor.

To further illustrate the problem associated with the parasitic resistance, FIG. 2 provides as an equivalent circuit of an embodiment of the claimed invention in reference to the prior art. In particular, FIG. 2 illustrates a two transistor analogy often employed to describe a thyristor. These two transistors are shown as T1 and T2. A thyristor anode (A) and cathode (C) are also shown. For easy reading, the lines connecting the prior art MOSFET (M2) to T2 are represented by the dashed lines while an embodiment of the claimed invention is represented by the solid lines. As shown, the equivalent circuit for the claimed invention is illustrated by the combination comprising T1, T2, and M2. Alternatively, the equivalent circuit for the prior art device is illustrated by the combination comprising T1, T2, R, and M1. The parasitic resistance caused by the physical separation between the p-channel region and p—n+ junction region is shown as resistor R. Placing the p-channel region of the MOSFET in close proximity to the p—n+ junction of the thyristor reduces this parasitic resistance, thereby reducing the effective resistance. Therefore, the MOSFET in the improved device can effectively shunt the thyristor turn-on current to switch the device off.

The prior art device of FIG. 1 can be referenced to the equivalent circuit of FIG. 2 as follows. The PNP transistor (T1) in FIG. 2 corresponds to the p+ layer, n− layer, and second p-type layer of FIG. 1. The NPN transistor (T2) in FIG. 2 corresponds to the n− layer, second p-type layer, and n+ well in FIG. 1. The MOSFET (M1) is defined by the p+ source region, p-channel region, and drain region. The parasitic resistance inherent in the physical separation between the p-channel region and p—n+ junction region is shown as resistor R in FIG. 2. The combination comprising T1, T2, R, and M1 defines a equivalent circuit for the prior art device.

MCT with Recessed Gate

Figure 3:
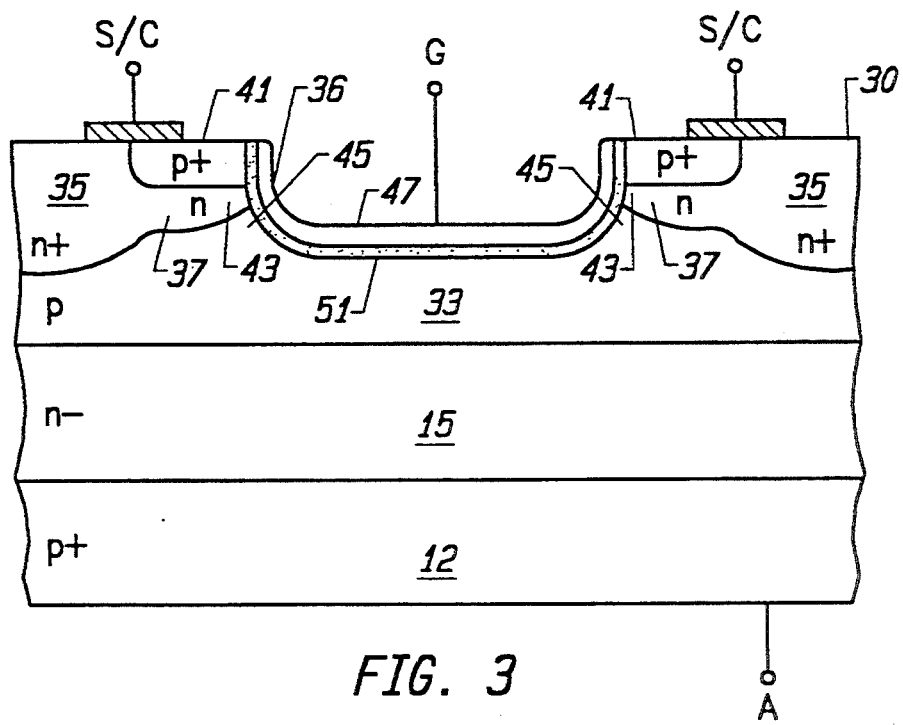
FIG. 3 is a cross-sectional view of an embodiment showing a recessed gate MOS-controlled thyristor.

An embodiment of the new and improved, non-planar MCT is a recessed gate MCT 30 shown in FIG. 3. As for the thyristor, a p+ layer 12 defines a thyristor anode (A). An n− layer 15 is on and in contact with the p+ layer, and a p-type layer 33 is on and in contact with the n− layer. An n+ well 35 is formed within the p-type layer defining a thyristor cathode (C). The p+ layer 12, n− layer 15, p-type layer 33, and n+ well 35 define a thyristor.

To complete the recessed gate MCT, a MOSFET is fabricated onto the structure shown above by, for example, a DMOS process. This embodiment shows a p-channel device for illustrative purposes. Alternatively, the device can be made with n-channel technology, and the like. A recess 36 is made, for example, by etching or other techniques well known in the art. An n-well 37 is formed adjacent to the thyristor n+ well. A source (S) is defined by the p+ source region 41 within the n-well. A p-channel region 43 within the n-well is adjacent to the gate (G), and between the p+ region and a portion of the p-type layer 45. A drain region is defined by this portion of p-type layer 45. A polysilicon gate 47 is overlying a layer of gate oxide 51, and above the p-channel region. Source region 41, p-channel region 43, and drain region 45 define a MOSFET device. As shown, the MOSFET is recessed into the surface of the thyristor. Therefore, the p-channel region is in close proximity to the active p—n+ junction.

Switching occurs through the following methods. To turn on the device, one provides a voltage to forward bias the p—n+ junction of the thyristor. To turn the device off, a negative voltage is applied to the MOSFET gate which forms the p-channel. This connects the p+ source region with the p-type layer, and effectively "shunts" the thyristor turn-on current, thereby turning the device off.

To optimize electrical characteristics, as well as processing of the device, the depth, width and shape of the recess are adjusted accordingly. The recessed gate geometry must bring the p-channel region in close proximity with the thyristor p—n+ junction to reduce the effective resistance. Preferably, the effective resistance should be low enough to create a forward voltage drop of about 0.6 volts or less. Reducing this resistance significantly improves the turn-off characteristics of this device over the prior art. Furthermore, dynamic turn-off takes less time.

MCT with Built-up Cathode

Figure 4:
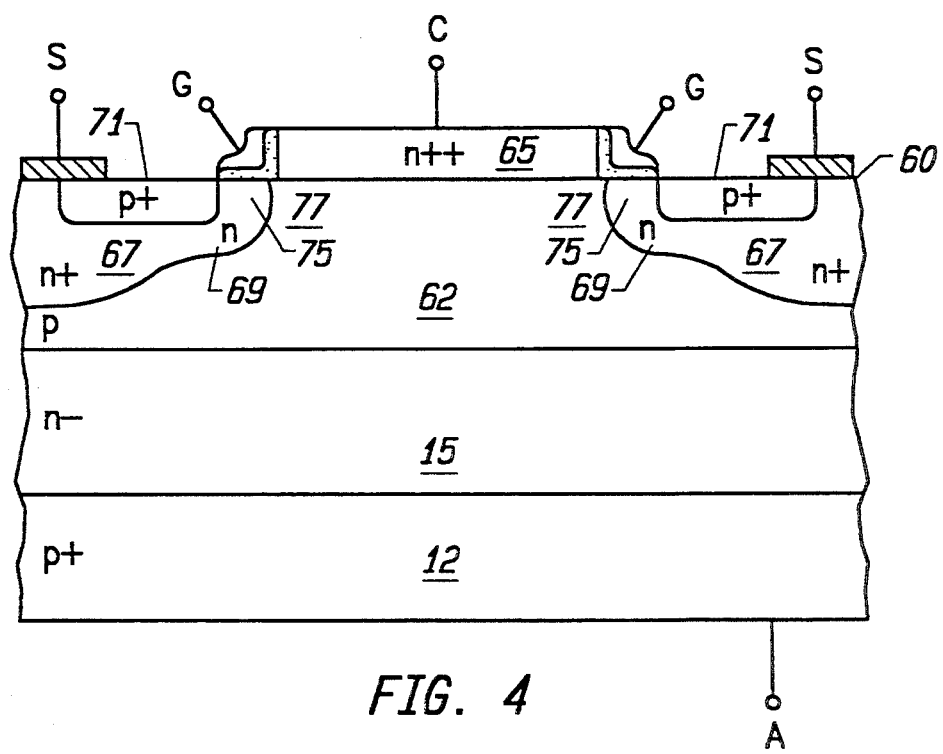
FIG. 4 is a cross-sectional view of another embodiment showing a projected gate MOS-controlled thyristor.

An alternative embodiment for the improved, non-planar MCT is a MCT with built-up cathode 60 shown in FIG. 4. A thyristor is defined by a p+ layer 12, an n− layer 15 overlying the p+ layer, a p-type layer 62 overlying the n− layer, and an n++ layer 65 on and in contact with the p-type layer. A thyristor anode (A) and cathode (C) are also shown.

As for a MOSFET, FIG. 4 shows a p-channel device, for example. An n+ well 67 is formed within the p-type layer, and an n-well 69 is formed adjacent to the n+ well. A p+ source region 71 defining a MOSFET source (S) is within the n-well. A p-channel region 75 within the n-well is adjacent to the surface of the device, and between the p+ region and a portion of the p-type region 77. A drain region is defined by this portion of p-type region 77. As shown, a gate (G) for the MOSFET is overlying the p-channel region. The p+ source region 71, p-channel region 75, and drain region 77 define a MOSFET. Since the p-channel region is in close proximity to the thyristor p−n++ junction, the built-up cathode geometry decreases the effective resistance within these two structures by reducing the parasitic resistance. Preferably, this effective resistance should cause a forward voltage drop of about 0.6 volts or less from the thyristor gate through the p-channel region.

Switching the MCT occurs as follows. The device switches on by applying a forward biasing voltage to the p−n++ junction. To turn off the device, a negative voltage is applied to the MOSFET gate. This forms a p-channel which connects the p+ source region with the p-type layer. Effectively, the MOSFET "shunts" the turn-on current at the thyristor p−n++ junction, thereby turning the device off. Since the p-channel region is in close proximity to the p−n++ junction of the thyristor, parasitic resistance is reduced. Therefore, turn-off takes less time and occurs more efficiently at high current.

Conclusion

The improved MCT shows superior performance over the prior art. The unique non-planar geometry of the present MCT brings the channel region of the MOSFET in close proximity to the active thyristor junction. This configuration decreases the effective resistance of this device by reducing parasitic resistance, thereby improving switching characteristics.

While the above is a full description of the specific embodiments, various modifications, alternative constructions, and equivalents may be used. For example, while the description above is in terms of a p-channel device, it would be possible to implement the present invention with an n-channel device, or the like. The thyristor shown was built by relying upon a p-n-p-n structure. A skilled artisan may, alteratively, employ an n-p-n-p structure, or the like. Furthermore, the different embodiments shown above may, for example, form a cellular configuration which defines the active regions of the device. Alternatively, the embodiments may form a stripe configuration, or the like.

Therefore, the above description and illustrations should not be taken as limiting the scope of the present invention which is defined by the appended claims.

What is claimed is:

1. A MOS-controlled thyristor semiconductor (MCT) device comprising:

a thyristor having a first layer of first conductivity type, a second layer of second conductivity type on and in contact with said first layer, and a first region including third and fourth layer, said third layer being of said first conductivity type and being on and in contact with said second layer, and said fourth layer being of said second conductivity type and being on and in contact with said third layer wherein a first junction is formed between said fourth layer and said third layer a MOSFET having a source region of first conductivity type, a channel region adjacent to said source, and a drain region of first conductivity type adjacent to said channel;

wherein said MOSFET and thyristor are integral forming a non-planar MCT wherein said channel and said first junction are in close proximity thereby reducing an effective resistance wherein:

said MCT having a surface, a portion of said surface of said MCT being a planar region;

said third layer has a well region of said second conductivity type, said well region extending to said planar region;

said fourth layer is on and in contact with a portion of said third layer;

said source region is within said well region and extends to said planar region;

said channel region is within a portion of said well region, is adjacent to said planar region, and is between said source region and a portion of said third layer; and said effective resistance causes a forward voltage drop of about 0.6 v. or less.

2. The device of claim 1 wherein said first conductivity type is an n-type.

3. The device of claim 1 wherein said first conductivity type is a p-type.

* * * * *